(12) United States Patent
Posamentier

(10) Patent No.: US 7,542,738 B2
(45) Date of Patent: Jun. 2, 2009

(54) METHOD AND APPARATUS FOR MEASURING AND COMPENSATING FOR POWER AMPLIFIER DISTORTION AND NON-LINEARITY

(75) Inventor: Joshua Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 562 days.

(21) Appl. No.: 11/314,228

(22) Filed: Dec. 21, 2005

(65) Prior Publication Data

US 2007/0142003 A1 Jun. 21, 2007

(51) Int. Cl.
*H04B 1/04* (2006.01)
*H03C 1/62* (2006.01)

(52) U.S. Cl. .................. 455/114.3; 455/126; 455/115.1

(58) Field of Classification Search ............... 455/114.3, 455/91, 108, 114.2, 126, 127.2, 63.1, 67.23, 455/115.1
See application file for complete search history.

(56) References Cited

U.S. PATENT DOCUMENTS

| | | | |
|---|---|---|---|
| 6,438,360 B1 * | 8/2002 | Alberth et al. ............... | 455/110 |
| 6,529,072 B2 * | 3/2003 | Takada ........................ | 330/149 |
| 6,606,483 B1 * | 8/2003 | Baker et al. .................. | 455/126 |
| 6,670,849 B1 * | 12/2003 | Damgaard et al. .......... | 330/129 |
| 6,801,784 B1 * | 10/2004 | Rozenblit et al. ........... | 455/522 |
| 6,836,646 B2 * | 12/2004 | Nagasaka .................... | 455/126 |
| 6,898,257 B2 * | 5/2005 | Fischer et al. ............... | 375/376 |
| 7,068,980 B2 * | 6/2006 | Seo et al. ....................... | 455/91 |
| 7,099,636 B2 * | 8/2006 | Rozenblit et al. ........... | 455/126 |
| 7,218,951 B2 * | 5/2007 | Rozenblit et al. ........... | 455/522 |
| 7,251,464 B2 * | 7/2007 | Khan et al. ............... | 455/114.3 |
| 7,277,687 B2 * | 10/2007 | Terry .......................... | 455/293 |
| 7,330,518 B2 * | 2/2008 | Kusunoki .................... | 375/297 |
| 7,369,871 B2 * | 5/2008 | Vakilian et al. ............. | 455/522 |
| 2008/0144709 A1 * | 6/2008 | McCallister et al. ........ | 375/233 |
| 2008/0146168 A1 * | 6/2008 | Jesson et al. ............... | 455/90.2 |
| 2008/0285640 A1 * | 11/2008 | McCallister et al. ........ | 375/233 |

\* cited by examiner

*Primary Examiner*—Sonny Trinh
(74) *Attorney, Agent, or Firm*—The Law Offices of John C. Scott, LLC; John C. Scott

(57) ABSTRACT

A power amplification system includes functionality for measuring and compensating for distortion and non-linearity in a power amplifier (PA). The compensation process may be performed repeatedly (or continuously) during the operational life of the PA to adapt to changing gain characteristics of the PA.

28 Claims, 5 Drawing Sheets

METHOD AND APPARATUS FOR MEASURING AND COMPENSATING FOR POWER AMPLIFIER DISTORTION AND NON-LINEARITY

TECHNICAL FIELD

The invention relates generally to power amplifiers and, more particularly, to techniques for measuring and compensating for distortion and non-linearity in power amplifiers.

BACKGROUND OF THE INVENTION

Many electronic applications have a need for linear power amplifiers. In the past, power amplifier linearity was often achieved by performing a factory calibration procedure to develop pre-emphasis compensation for the power amplifier to linearize the gain thereof. The compensation information would then be stored within the device carrying the power amplifier for use throughout the life of the amplifier. This factory calibration procedure can be complex and costly to perform for each item in a production line. In addition, this calibration technique only compensates for distortion in the power amplifier under the conditions that exist at the time the calibration is performed and does not provide compensation for effects such as gain variation as a function of junction temperature, gain variation as a function of component aging, non-linearity effects associated with the use of different modulation techniques, and/or other gain variations that might occur during component operation. There is a need for power amplifier linearization techniques that are capable of adapting to changing conditions associated with an amplifier.

DETAILED DESCRIPTION

Figure 1:
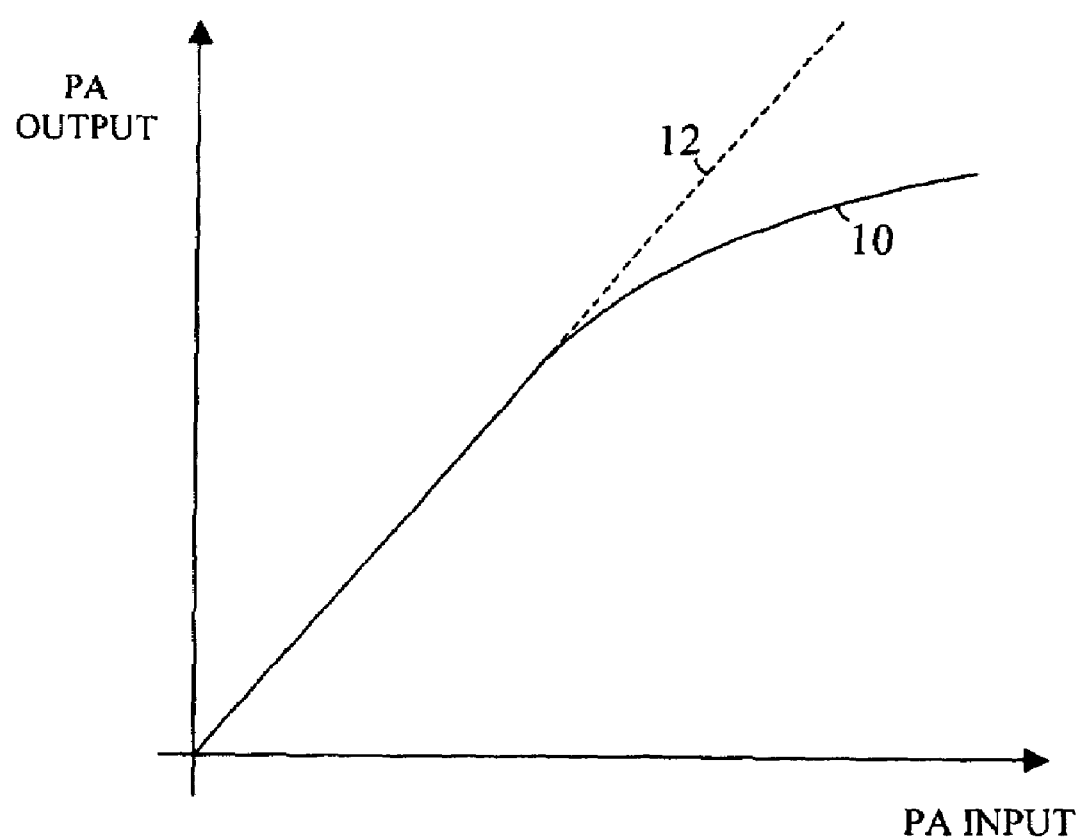
FIG. 1 is a graph illustrating an input-output characteristic for a power amplifier (PA) that may be linearized in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a graph illustrating an input-output characteristic 10 for a power amplifier (PA) that may be linearized in accordance with an embodiment of the present invention. As shown, an ideal input-output characteristic 12 is linear throughput the full range of input signal power. That is, the ideal PA has relatively constant gain regardless of the level of the input signal. In the actual input-output characteristic 10, however, the gain is relatively linear for lower level input signals, but falls off as the level of the input signal increases. In many applications, it is desirable to have a linear gain throughout a given operational range. For example, in applications that use modulation schemes where information is carried in a signal's amplitude (e.g., amplitude modulation (AM), quadarature amplitude modulation (QAM), amplitude shift keying (ASK), single sideband modulation (SSB), and/or others), linear PA operation is important. In one aspect of the present invention, techniques are provided for generating an input-output characteristic for a PA on the fly during PA operation. Once a characteristic has been generated, compensation values can be determined for use in linearizing the operation of the PA. This process may be performed in a continuous or repetitive manner during the life of a PA to maintain linear operation. By implementing features of the invention, the comprehensive PA pre-emphasis calibrations that are typically performed as part of the PA manufacturing process may be dispensed with, thereby reducing manufacturing costs considerably (although basic calibrations may still be performed in some embodiments of the invention). In addition, the invention allows gain variations in PAs that occur after manufacture (e.g., temperature related variations, component age related variations, modulation related variations, etc.) to be compensated for during the life of the amplifier.

Figure 2:
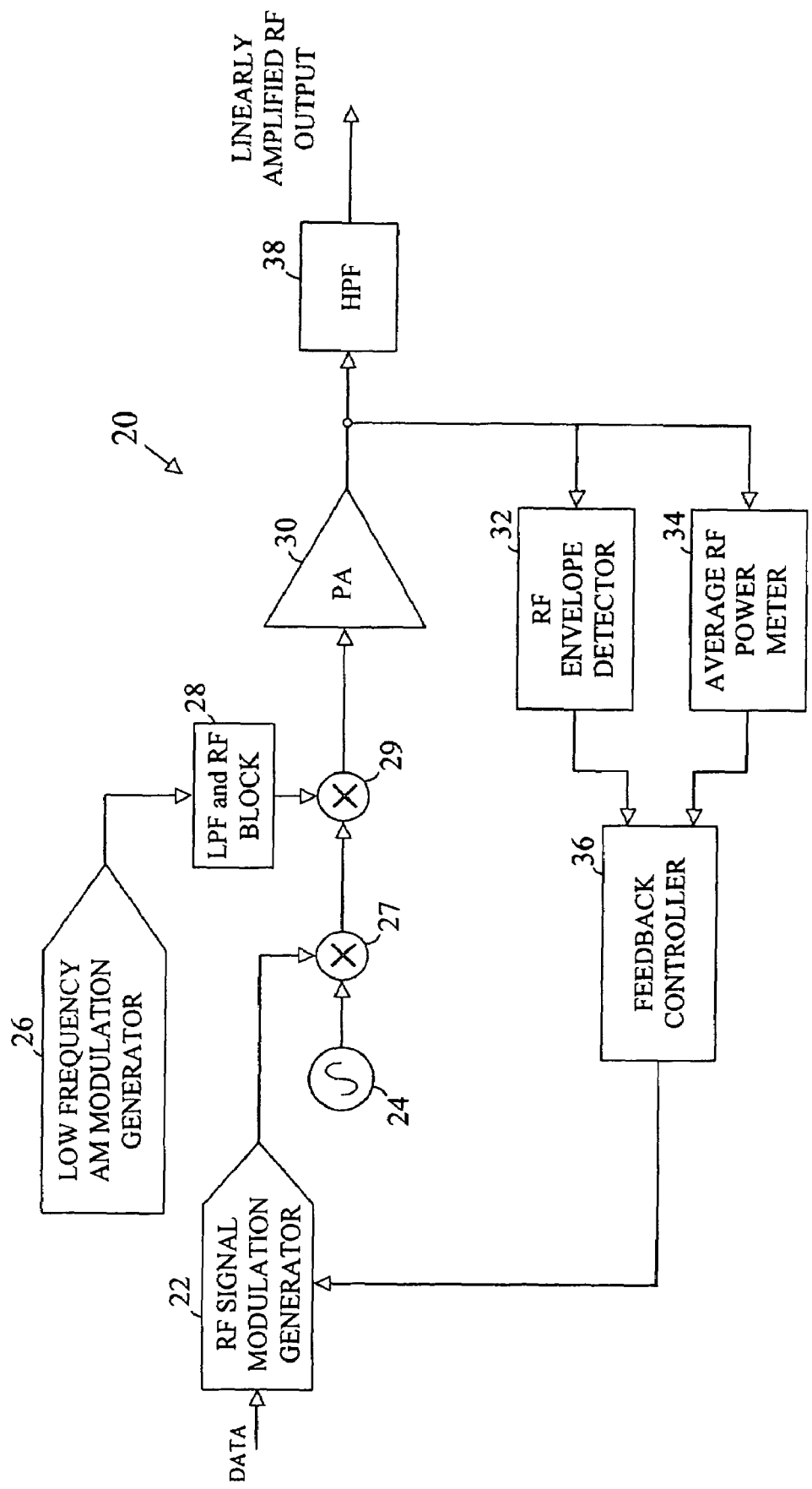
FIG. 2 is a block diagram illustrating a power amplification system in accordance with an embodiment of the present invention.

FIG. 2 is a block diagram illustrating an example power amplification system 20 in accordance with an embodiment of the present invention. The power amplification system 20 is capable of achieving linear amplifier operation even though a PA having a non-linear characteristic is used within the system 20. As will be described in greater detail, the power amplification system 20 uses a closed loop feedback approach to achieve linear performance. As illustrated, the power amplification system 20 may include one or more of: a radio frequency (RF) signal modulation generator 22, an RF signal source 24, a low frequency AM modulation generator 26, a low pass filter (LPF) and RF block 28, first and second modulators 27, 29, a PA 30, an RF envelope detector 32, an average RF power meter 34, a feedback controller 36, and a high pass filter 38. The RF signal source 24 is operative for generating an RF carrier signal that can be modulated to carry data or other information. The RF signal modulation generator 22 generates the modulation signal that is used to modulate the RF carrier. In at last one approach, amplitude shift keying (ASK) is used as a modulation scheme by the RF signal modulation generator. Other modulation schemes may alternatively be used. The RF signal modulation generator 22 may receive data from a data source for use in generating the modulation signal. The modulation signal may be delivered to a first modulator 27 to modulate the carrier signal.

As will be described in greater detail, the low frequency AM modulation generator 26 generates a low frequency AM modulation signal that may be used to further modulate the carrier in a manner that allows the input-output characteristic of the PA 30 to be estimated. This low frequency AM modulation may then be removed from the RF signal after amplification but before the RF signal is output by the power amplification system 20. In at least one embodiment, the low frequency AM modulation signal is a sinusoid, although other signal types may alternatively be used (e.g., square wave, etc.). The LPF and RF block 28 is used to prevent higher frequencies generated by the low frequency AM modulation generator 26 (e.g., harmonics, etc.) from reaching the PA 30 and also to block RF frequencies in the modulated RF signal from reaching the generator 26. The filtered low frequency AM modulation signal may be delivered to the second modulator 29 to modulate the input signal before it is applied to the PA 30.

The PA 30 amplifies the input signal to generate an amplified output signal. The RF envelope detector 32 and the average RF power meter 34 measure features of the amplified output signal for use in a feedback loop designed to compensate for non-linearities in the power amplification system 20. The features that are measured are ones that allow an input-output characteristic of the PA 30 to be generated. It should be appreciated that other techniques for measuring features of the amplified output signal of the PA (i.e., other than envelope detection and average RF power measurement) from which an input-output characteristic can be developed may alternatively be used. The measured features (or information derived therefrom) may be delivered to the feedback controller 36 for use in generating an input-output characteristic for the PA 30. The feedback controller 36 may then use the estimated characteristic to develop compensation values for use in compensating for nonlinearities of the PA 30. The compensation values may be delivered to the RF signal modulation generator 22 for use in generating the RF modulation signal that will be used to modulate the RF carrier. The RF signal modulation generator 22 may use the compensation values received from the feedback controller 36 to provide pre-emphasis within the modulation signal in a manner that will reduce non-linearity in the system.

The HPF 38 is operative for high pass filtering the amplified output signal of the PA 30 to remove low frequency components resulting from the low frequency modulation associated with the modulation generator 26. The output of the HPF 38 is a linearly amplified version of a modulated RF signal that includes the data (or other information) originally input to the RF signal modulation generator 22. The output of the HPF 38 may then be delivered to an application specific destination. For example, when the power amplification system 20 is being used within a wireless communication application, the output of the HPF 38 may be delivered to an antenna to be transmitted to a remote wireless entity. Any type of antenna may be used including, for example, a dipole, a patch, a helical antenna, and/or others. In another application, the power amplification system 20 may be used within a wired communication network, in which case the output of the HPF 38 may be delivered to a wired network medium. Other power amplifier applications also exist.

The RF envelope detector 32 detects the envelope of the amplified signal output by the PA 30 and delivers information related to this envelope to the feedback controller 36. This information may include the full envelope, one or more portions of the envelope, information derived from the envelope, or other envelope-related information. The information may be digitized before being delivered to the feedback controller 36. The average power meter 34 measures the average RF power of the amplified signal output by the PA 30 and delivers this information to the feedback controller 36. As described previously, the feedback controller 36 may use the information received from the RF envelope detector 32 and the average power meter 34 to generate an input-output characteristic for the PA 30. The characteristic may then be used to develop compensation information. In at least one embodiment, the low frequency AM modulation applied by the low frequency AM modulation generator 26 is such that the modulation will not change the average power level of the signal modulated thereby (e.g., sinusoidal modulation, square wave modulation, etc.).

In one approach, the low frequency AM modulation generator 26 may provide dithering to the data modulated RF carrier to vary an amplitude of the signal between a high and a low value. The normal (non-dithered) amplitude of the data modulated RF carrier may be somewhere between the high and low amplitude values. When the signal including the dithering is applied to the PA 30, the PA 30 will amplify the high and low amplitude values differently based on the non-linear characteristic of the PA 30. The RF envelope detector 32 measures the envelope of the PA output signal. The feedback controller 36 or the envelope detector 32 can then read the amplitude of the envelope at portions of the PA output signal corresponding to the high and low amplitudes of the PA input signal. The feedback controller 36 can then use this information, in addition to the average power information, to generate input-output points of the input-output characteristic of the PA 30. The input-output characteristic may then be generated by the feedback controller 36 using, for example, a well known nonlinear regression algorithm or other curve fitting technique (e.g., a rolling average curve fit, etc.) to find a best fit curve for the measured points. The feedback controller 36 may be implemented using a digital processing device such as, for example, a general purpose microprocessor, a digital signal processor (DSP), a reduced instruction set computer (RISC), a complex instruction set computer (CISC), a microcontroller, a field programmable gate array (FPGA), an application specific integrated circuit (ASIC), and/or others, including combinations of the above. The digital processing device may be a dedicated unit (i.e., dedicated to feedback functions) or a unit that also performs other processing functions within the system.

Figure 3:
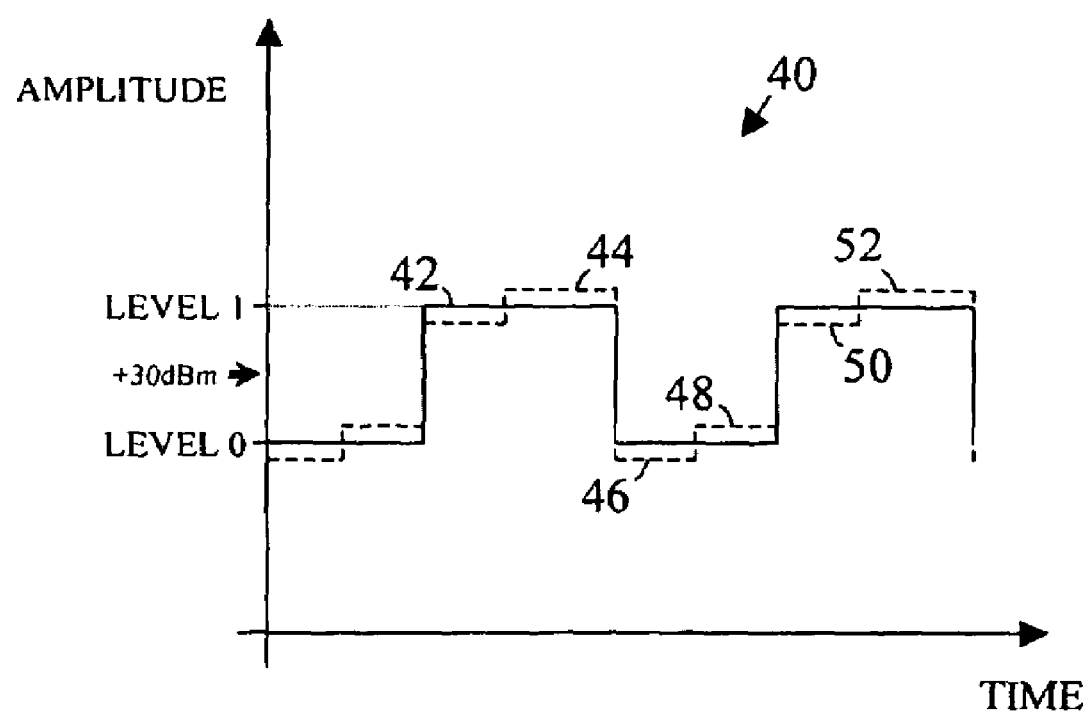
FIG. 3 is a signal diagram illustrating an amplitude plot of an example input signal that may be applied to a PA in accordance with an embodiment of the present invention.

FIG. 3 is a signal diagram illustrating an amplitude plot of an example input signal 40 that may be applied to the PA 30 in the system 20 of FIG. 2 in accordance with an embodiment of the present invention. The input signal 40 uses ASK modulation as the data modulation scheme to modulate the RF carrier. The ASK modulation modulates the carrier signal between two (or more) amplitude levels based on, for example, an input data signal. Additional low frequency dithering modulation is added to the ASK modulated RF signal for use in developing the feedback information to be used to generate the input-output characteristic. The ASK modulated signal without dithering is shown as plot 42 and the ASK modulated signal with dithering is shown as plot 44. As illustrated, for each amplitude level in the ASK modulation (e.g., LEVEL 0 and LEVEL 1 in FIG. 3), the dither tone may further vary the signal between multiple dither levels so that gain information may be measured for these multiple levels. For example, in the illustrated embodiment, for a first level (LEVEL 0) of the ASK modulated signal, the dither tone may vary the amplitude of the signal between a first dither level 46 and a second dither level 48. Likewise, for a second level (LEVEL 1) of the ASK modulated signal, the dither tone may vary the amplitude of the signal between a third dither level 50 and a fourth dither level 52. It should be noted that the dither modulation will typically be a lower frequency modulation than the data modulation (e.g., the ASK modulation in FIG. 3) to allow the dithering to be filtered out after amplification. However, to facilitate understanding, the dither modulation in FIG. 3 has a higher frequency to better illustrate the changing dither levels. Although two dither levels are shown for each level of the ASK modulated signal, it should be appreciated that other numbers of dither levels may alternatively be used. It should also be appreciated that modulation schemes other than ASK may be used to data modulate the RF carrier.

When the signal 40 is applied to the PA, each of the dither levels 46, 48, 50, 52 will generate a corresponding PA output level based on the input-output characteristic of the PA. Each of these output levels may then be measured and recorded. Each output level and the corresponding input level will then form a dither state of the amplification system. Once a number of dither states have been collected, a regression algorithm may be used to develop a best fit curve for the dither states to generate the input-output characteristic of the amplification system.

Figure 4:
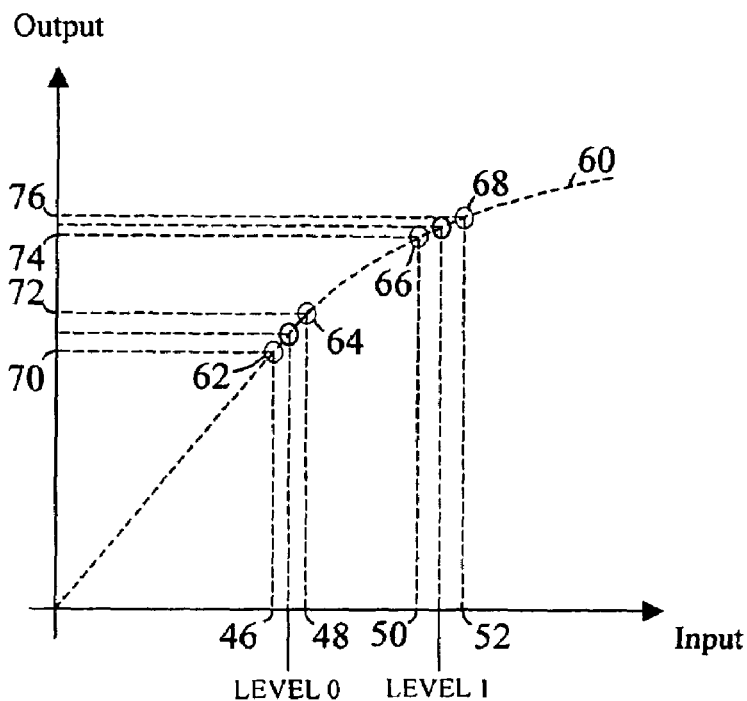
FIG. 4 is a graph illustrating the location of dither states on an example input-output characteristic for a PA in accordance with an embodiment of the present invention.

FIG. 4 is a graph illustrating an example input-output characteristic 60 for a PA that shows the location of the dither states in accordance with an embodiment of the present invention. It is assumed that the input-output characteristic 60 of the PA is unknown before the process is commenced. Dither states 62, 64, 66, 68 may then be measured for the PA during normal PA activity. As shown, a first dither state 62 may correspond to the first dither level 46 in FIG. 3, a second dither state 64 may correspond to the second dither level 48 in FIG. 3, a third dither state 66 may correspond to the third dither level 50 in FIG. 3, and a fourth dither state 68 may correspond to the fourth dither level 52 in FIG. 3. The output levels 70, 72, 74, 76 corresponding to the four dither states 62, 64, 66, 68 may be measured within the amplification system. These output values may be derived, for example, from the envelope detected by the RF envelop detector 32 and the average power level measured by the average power meter 34 (see FIG. 2). Once input and output values have been collected to form the four dither states 62, 64, 66, 68, nonlinear regression may be used to determine a best fit curve for the input-output characteristic of the PA.

Figure 5:
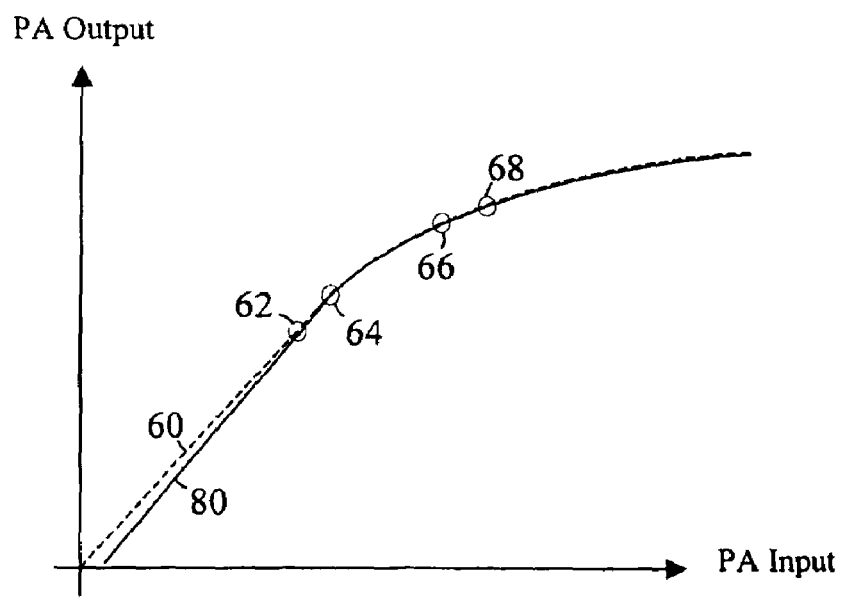
FIG. 5 is a graph illustrating an example best fit input-output characteristic that may be developed for a PA using the dither states illustrated in FIG. 4.

FIG. 5 is a graph illustrating an example best fit input-output characteristic 80 that may be developed for a PA from the dither states 62, 64, 66, 68 of FIG. 4. Any type of curve fitting algorithm may be used to generate an input-output characteristic for the PA including, for example, a best fit polynomial solution, a cubic fit, a bicubic spline fit, and/or others. Once the input-output characteristic 80 has been generated, the characteristic may be used to develop pre-emphasis compensation values (or pre-emphasized waveforms) to compensate for non-linearities in the characteristic. In at least one embodiment, the pre-emphasis compensation values or waveforms may be delivered to the RF signal modulation generator 22 (FIG. 2) for use in developing the modulation signal.

Figure 6:
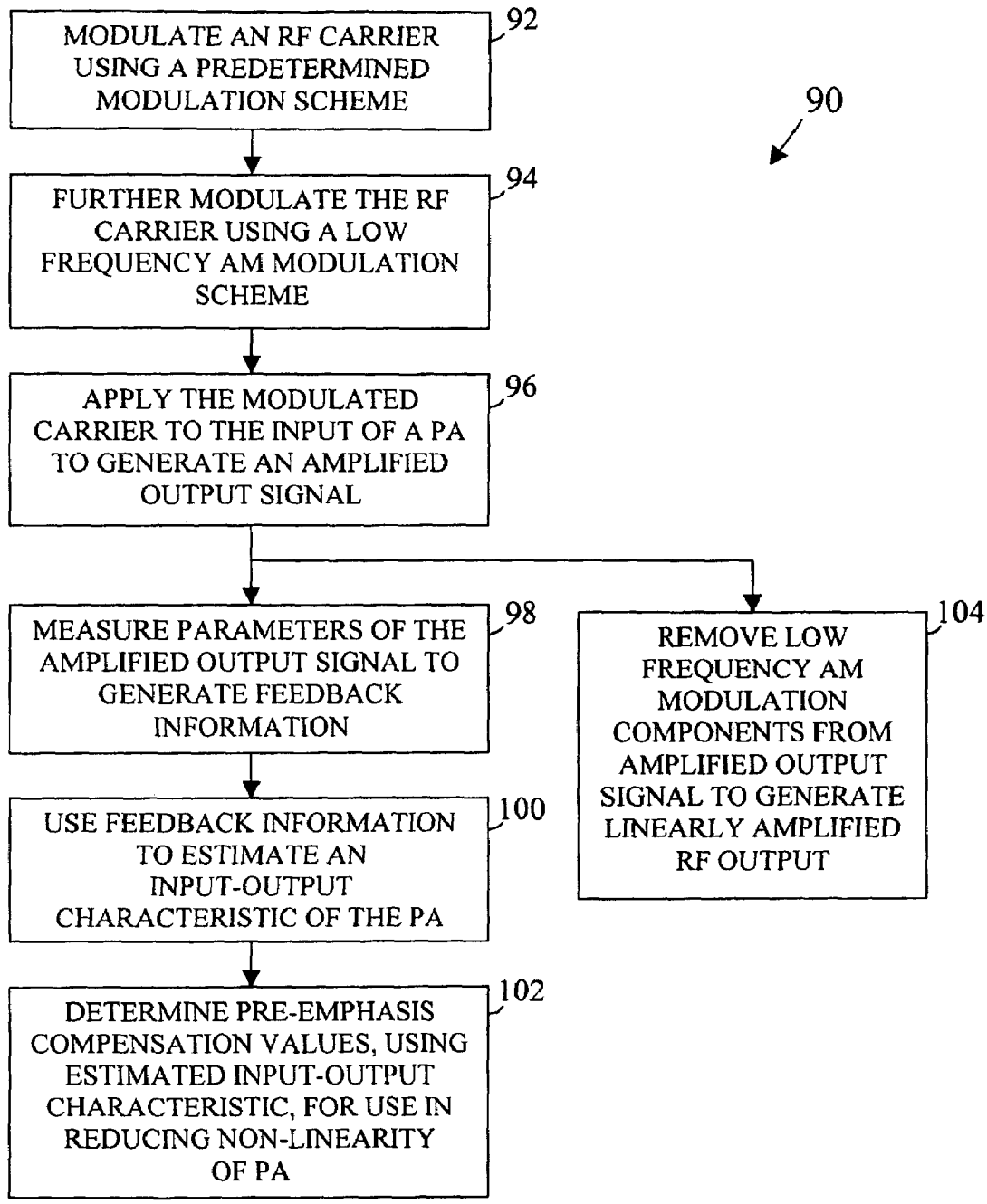
FIG. 6 is a flowchart illustrating a method for use in linearizing the operation of a PA in accordance with an embodiment of the present invention.

FIG. 6 is a flowchart illustrating a method 90 for use in linearizing the operation of a PA in accordance with an embodiment of the present invention. The method 90 may be performed in connection with the power amplification system 20 of FIG. 2 and in other power amplification systems having non-linear PAs. An RF carrier is first modulated using a predetermined modulation scheme (block 92). The RF carrier may then be further modulated using a low frequency AM modulation (block 94). The low frequency AM modulation may be a modulation scheme that dithers the amplitude of the modulated RF carrier signal about one or more amplitude levels thereof. Thus, when the data modulated signal has a first amplitude level, the low frequency AM modulation may dither the amplitude of the signal higher and lower than this first amplitude level, when the data modulated signal has a second amplitude level, the low frequency AM modulation may dither the amplitude of the signal higher and lower than the second amplitude level, and so on. Any number of dither levels may be used for a particular level of the modulated RF carrier signal (i.e., it is not limited to just one high and one low level). Any of a number of different AM modulation signal types may be used to perform the dithering including, for example, sinusoidal modulation signals, square wave modulation signals, and/or others. The low frequency AM modulation should be of a frequency that is low enough to be easily removed to generate the output signal of the amplification system. The low frequency AM modulation of the carrier may be performed before, during, or after the data modulation is performed.

After the RF carrier has been modulated, the signal may be applied to the input of a PA (block 96). The PA amplifies the modulated signal to generate an amplified output signal. Features of the amplified output signal are then measured to generate feedback information (block 98). As illustrated in FIG. 4, in at least one embodiment, a level of the amplified output signal is determined for each of a plurality of known input levels that are achieved by dithering the input signal. In one approach, the level of the amplified output signal may be determined by detecting an envelope of the output signal, measuring an average RF power level of the output signal, and using the average RF power level and the detected envelop to calculate the desired output levels. Other techniques for determining the output levels that correspond to known input levels may alternatively be used. Although only two dither levels are shown in FIG. 3 for each level of the modulated RF signal, it should be appreciated that additional dither states may be used and additional output levels determined.

After the feedback information has been generated, the information may be used to generate an input-output characteristic of the PA (block 100). In at least one approach, non-linear regression techniques may be used to generate a best fit curve for the collected feedback information. Other curve fitting techniques may alternatively be used. After the input-output characteristic has been generated, pre-emphasis compensation values or pre-emphasized waveforms may be generated based on the characteristic (block 102). That is, values or waveforms may be generated that indicate how much pre-emphasis needs to be used for various levels of a modulated input signal so that the PA output is relatively linear. Once the pre-emphasis information has been determined, it may be used to compensate for non-linearities in the system. This compensation may be performed using digital and/or analog techniques. In one possible approach, pre-emphasis compensation information, along with the input data to be amplified, are used in generating a subsequent modulation signal for the RF carrier.

After the PA generates the amplified output signal, all low frequency AM modulation components may be removed from the amplified signal before it proceeds to a system output (block 104). In one possible approach, a high pass filter is used to perform this function (see, e.g., FIG. 2). Other techniques may alternatively be used to remove the low frequency components. The method 90 described above may be performed repetitively or continuously during power amplifier operation so that linear operation is maintained. In this manner, an amplification system may adapt to a changing gain scenario caused by any of a number of different factors. Because the calibrations are performed during the operational life of the PA, complex calibration procedures do not need to be performed during component manufacture, thus reducing manufacturing costs. The technique is also less costly to implement than prior closed loop linearization techniques that employ an entire receive chain to observe the output of an amplifier.

The techniques and structures of the present invention may be implemented in any type of component, device, or system requiring linear power amplification. For example, features of the invention may be embodied within RF transmitters within: cellular telephones and other handheld wireless communicators; personal digital assistants having wireless capability; laptop, palmtop, desktop, and tablet computers having wireless capability; wireless network access points; base stations; pagers; RFID devices; satellite communicators; terrestrial wireless communicators; cameras having wireless capability; audio/video devices having wireless capability, network interface cards (NICs) and other network interface structures; RADAR systems; wired networking devices; integrated circuits; wireless networking chipsets; cellular chipsets; RFID chipsets; and/or other structures. Features of the invention may also be implemented as instructions and/or data structures stored on machine readable media, and/or in other formats. Examples of different types of machine readable media that may be used include floppy diskettes, hard disks, optical disks, compact disc read only memories (CD-ROMs), digital video disks (DVDs), Blu-Ray disks, magneto-optical disks, read only memories (ROMs), random access memories (RAMs), erasable programmable ROMs (EPROMs), electrically erasable programmable ROMs (EEPROMs), magnetic or optical cards, flash memory, and/or other types of media suitable for storing electronic instructions or data.

It should be appreciated that the individual blocks illustrated in the block diagrams herein may be functional in nature and do not necessarily correspond to discrete hardware elements. For example, in at least one embodiment, two or more of the blocks in a block diagram are implemented in software within a single (or multiple) digital processing device(s). The digital processing device(s) may include, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. Hardware, software, firmware, and hybrid implementations may be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A method comprising:
   modulating a radio frequency (RF) signal using low frequency amplitude modulation (AM) to generate a low frequency AM modulated RF signal;
   applying said low frequency AM modulated RF signal to a power amplifier (PA) to generate an amplified signal;
   measuring features of said amplified signal that are related to said low frequency AM modulation;
   generating an input-output characteristic for said PA based on said measured features of said amplified signal; and
   using said input-output characteristic to generate pre-emphasis compensation information for use in compensating for a non-linear gain of said PA;
   wherein said low frequency AM dithers said RF signal between multiple known amplitude levels: and
   wherein measuring features of said amplified signal includes determining amplitude levels of said amplified signal corresponding to said known amplitude levels of said AM modulated RF signal.

2. The method of claim 1, further comprising:
   repeating modulating, applying, measuring, generating, and using regularly during an operational life of said PA to maintain linear operation.

3. The method of claim 1, wherein:
   said RF signal is a data modulated RF carrier that is being used to transfer data to another location.

4. The method of claim 1, further comprising:
   using said pre-emphasis compensation information to generate a modulation signal.

5. The method of claim 1, wherein:
   said low frequency AM modulated RF signal is further modulated using input data before it is applied to the PA.

6. The method of claim 1, wherein:
   generating an input-output characteristic includes performing non-linear regression using a number of dither states, each dither state including an input level of said PA and a corresponding measured output level of said PA.

7. The method of claim 1, further comprising:
   removing low frequency AM modulation components from said amplified signal to generate a linearly amplified output RE signal.

8. The method of claim 7, wherein:
   removing low frequency AM modulation components from said amplified signal includes high pass filtering said amplified signal.

9. An apparatus comprising:
   a modulator to modulate a radio frequency (RF) signal with low frequency amplitude modulation (AM);
   a power amplifier (PA) to amplify said RF signal, after said modulator has modulated said RF signal, to generate an amplified RF signal;
   at least one measurement device to measure one or more features of said amplified RF signal; and
   a controller to generate an input-output characteristic for said PA based on said one or more measured features;
   wherein said low frequency AM dithers said RF signal between multiple known amplitude levels; and
   wherein said at least one measurement device measures amplitude levels of said amplified RF signal corresponding to said known amplitude levels of said AM modulated RF signal.

10. The apparatus of claim 9, wherein:
    said controller generates said input-output characteristic using nonlinear regression techniques.

11. The apparatus of claim 9, wherein:
said controller is to generate pre-emphasis compensation information using said input-output characteristic for use in compensating for a non-linear gain of said PA.

12. The apparatus of claim 9, wherein:
said at least one measurement device includes an RF envelope detector to detect an envelope of said amplified RF signal.

13. The apparatus of claim 12, wherein:
said at least one measurement device includes an average RF power meter to measure an average RF power of said amplified RF signal.

14. The apparatus of claim 9, wherein:
said RF signal is a data modulated RF carrier.

15. The apparatus of claim 14, wherein:
said data modulated RE carrier was modulated using amplitude shift keying (ASK).

16. The apparatus of claim 9, wherein:
said controller generates said input-output characteristic for said PA based on multiple measured dither states of said PA, each dither state including an input RF amplitude and a corresponding output RF amplitude.

17. The apparatus of claim 9, further comprising:
a high pass filter to remove low frequency components from said amplified RF signal.

18. A computer implemented method comprising:
obtaining information on multiple dither states measured for a power amplifier (PA), each dither state including an input amplitude value and a corresponding output amplitude value for said PA;
generating an input-output characteristic for said PA using non-linear regression and said information; and
calculating pre-emphasis compensation information for said PA, using said input-output characteristic, for use in linearizing operation of said PA.

19. The method of claim 18, further comprising:
repeating obtaining, generating, and calculating regularly during an operational life of said PA to maintain linear operation.

20. The method of claim 18, wherein:
obtaining information includes receiving an RF envelope of an amplified RF signal generated by said PA, receiving an average RF power level of said amplified RF signal, and using said RF envelope and said average RF power level to determine output amplitude levels for said multiple dither states, wherein said RF signal has been modulated with a low frequency AM dither modulation before being applied to said PA.

21. The method of claim 18, wherein:
generating an input-output characteristic includes using a bicubic spline form of regression.

22. An article comprising a computer readable storage medium having instructions stored thereon that, when executed by a computing platform, operate to:
obtain information on multiple dither states measured for a power amplifier (PA), each dither state including an input amplitude value and a corresponding output amplitude value for said PA;
generate an input-output characteristic for said PA using non-linear regression and said information; and
calculate pre-emphasis compensation information for said PA, using said input-output characteristic, for use in linearizing operation of said PA.

23. The article of claim 22, wherein said instructions further operate to:
repeat operation to obtain information, operation to generate, and operation to calculate regularly during an operational life of said PA to maintain linear operation thereof.

24. The article of claim 22, wherein:
operation to obtain information includes operation to receive an RF envelope of an amplified RF signal generated by said PA, operation to receive an average RF power level of said amplified RF signal, and operation to use said RE envelope and said average RE power level to determine output amplitude levels for said multiple dither states, wherein said RF signal has been modulated with a low frequency AM dither modulation before being applied to said PA.

25. A system comprising:
a modulator to modulate a radio frequency (RF) signal with low frequency amplitude modulation (AM);
a power amplifier (PA) to amplify said RF signal, after said modulator has modulated said RF signal, to generate an amplified RF signal;
at least one measurement device to measure one or more features of said amplified RF signal;
a controller to generate an input-output characteristic for said PA using said one or more measured features; and
an antenna to transmit a signal output by said PA;
wherein said low frequency AM dithers said RF signal between multiple known amplitude levels: and
wherein said at least one measurement device measures amplitude levels of said amplified RF signal corresponding to said known amplitude levels of said AM modulated RF signal.

26. The system of claim 25, wherein:
said controller generates said input-output characteristic using nonlinear regression techniques.

27. The system of claim 25, wherein:
said controller is to generate pre-emphasis compensation information using said input-output characteristic for use in compensating for a non-linear gain of said PA.

28. The system of claim 25, further comprising:
a high pass filter between an output of said PA and said antenna to remove low frequency AM modulation components from said amplified RF signal.

* * * * *